United States Patent [19]

Izu et al.

[11] 4,410,558
[45] * Oct. 18, 1983

[54] CONTINUOUS AMORPHOUS SOLAR CELL PRODUCTION SYSTEM

[75] Inventors: Masatsugu Izu, Birmingham; Vincent D. Cannella, Detroit; Stanford R. Ovshinsky, Bloomfield Hills, all of Mich.

[73] Assignee: Energy Conversion Devices, Inc., Troy, Mich.

[*] Notice: The portion of the term of this patent subsequent to May 19, 2000 has been disclaimed.

[21] Appl. No.: 240,493

[22] Filed: Mar. 16, 1981

Related U.S. Application Data

[63] Continuation-in-part of Ser. No. 151,301, May 19, 1980.

[51] Int. Cl.³ .......................................... H01L 31/04
[52] U.S. Cl. ........................................ 427/39; 29/572; 427/74; 427/75; 427/86; 204/38 A; 148/1.5
[58] Field of Search .................... 29/572; 427/74–75, 427/86, 39; 204/38 A; 148/1.5

[56] References Cited

U.S. PATENT DOCUMENTS

| 3,367,304 | 2/1968 | Robbins | 118/719 |
| 3,969,163 | 7/1976 | Wakefield | 29/572 |
| 4,064,521 | 12/1977 | Carlson | 427/39 |
| 4,226,898 | 10/1980 | Ovshinsky | 427/39 |

FOREIGN PATENT DOCUMENTS 55-125681 9/1980 Japan.

Primary Examiner—John D. Smith
Attorney, Agent, or Firm—Marvin S. Siskind

[57] ABSTRACT

The continuous production of solar cells by the glow discharge (plasma) deposition of layers of varying electrical characteristics is achieved by advancing a substrate through a succession of deposition chambers. Each of the chambers is dedicated to a specific material type deposition. The chambers are mutually isolated to avoid the undesired admixture of reaction gases therebetween. Each plasma deposition is carried out in its glow discharge area, chamber, or chambers, with isolation between the plasma regions dedicated to different material types. Masking, mechanical or lithographic, can be employed relative to the substrate to cause the deposition in the desired configuration. After the semiconductor deposition is complete, top contact and antireflection layer or layers are deposited, followed by a protective lamination.

21 Claims, 7 Drawing Figures

CONTINUOUS AMORPHOUS SOLAR CELL PRODUCTION SYSTEM

This is a continuation-in-part of United States patent application Ser. No. 151,301 filed May 19, 1980 entitled "A Method of Making P-Doped Silicon Films and Devices Made Therefrom."

BACKGROUND OF THE INVENTION

This invention is directed to a method and apparatus for the production of solar cells whereby adjacent layers of amorphous semiconductor material of differing conductivity types are deposited in separate dedicated glow discharge chambers.

Photovoltaic devices are known as structure by which solar radiation can be converted into useable electrical energy. One of the known devices in this class is a silicon solar cell which has a multi-layered, doped body of amorphous silicon. Such a silicon solar cell and the process of successive deposition of doped layers within a glow discharge chamber to build up the solar cell structure is described in U.S. Pat. No. 4,226,898, Stanford R. Ovshinsky and Arun Madan, issued from U.S. patent application Ser. No. 887,353, filed Mar. 16, 1978 for AMORPHOUS SEMICONDUCTORS EQUIVALENT TO CRYSTALLINE SEMICONDUCTORS PRODUCED BY A GLOW DISCHARGE PROCESS. The patent disclosure of which is incorporated into this disclosure in its entirety. This patent teaches the formation of the various doped and intrinsic layers of amorphous material in a single vacuum chamber within a housing. Conduits allow the successive admission of various reaction gas mixtures both containing various dopants (in the production of doped layers), and free of dopants (in the production of intrinsic material.)

With the batch-processing in a single chamber, the optimization and manufacturing speed of the finished structure device cells is more restricted than desired. The production of multilayer devices including adjacent layers of differing material types (including intrinsic layers) when performed in a single glow discharge chamber requires complex control apparatus and time consuming techniques. In particular, the initializing of the vacuum and substrate temperature for each device and cooling following the deposition of the device layers greatly lengthens the average device fabrication time.

Further, the contamination of the different material type layers, especially the intrinsic layer, with undesired process or other elements must be avoided for optimum device function. In a single chamber process, this requires added intermediate evacuation steps to avoid cross contamination.

SUMMARY OF THE INVENTION

The above and other disadvantages of prior art systems and techniques is overcome in accordance with the present invention by depositing adjacent layers of amorphous semiconductor material of differing electrical characteristics on a substrate in separate environmentally dedicated glow discharge regions. The dedicated regions can be a plurality of adjacent chambers each one or ones of which are provided with a preselected gas mixture and are isolated from one another to eliminate cross contamination. The substrate is sequentially advanced or transported through the dedicated regions or chamber to deposit thereon adjacent layers of differing electrical characteristics as required for a particular cell configuration. The substrate can be a continuous web, such as stainless steel, which is fed substantially continuously through the dedicated regions or chambers to deposit the desired device cell configuration thereon. Masking can be utilized as desired for particular device configurations.

Other objects and advantages of this invention will appear from a study of the following portion of the specification, the claims and the attached drawings.

DESCRIPTION OF THE PREFERRED EMBODIMENTS

Figure 1:
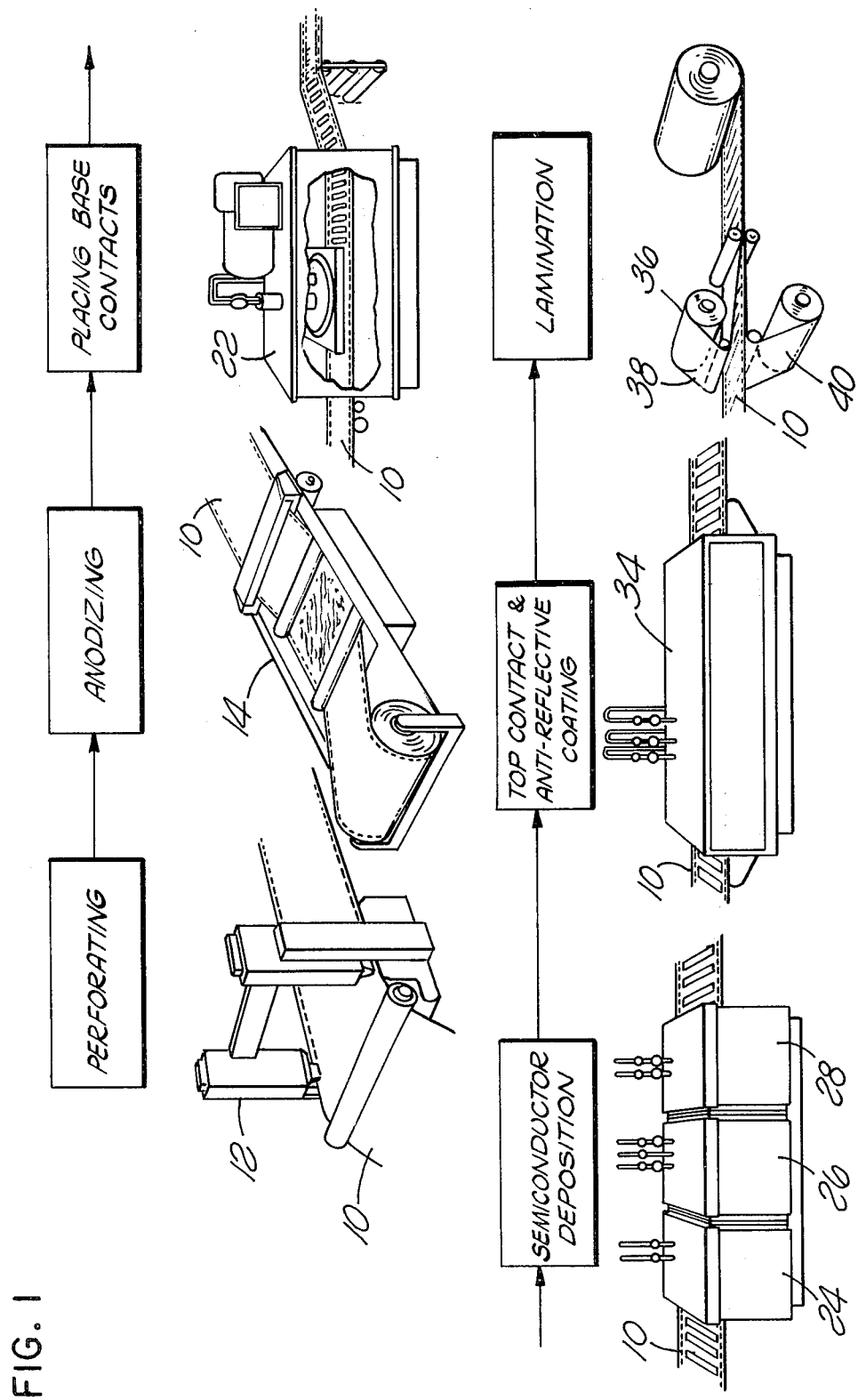
FIG. 1 is a combined diagrammatic and perspective view of one embodiment of the continuous solar cell production system of this invention.

FIG. 1 schematically illustrates the various steps in one embodiment of the continuous solar cell production system. The substrate 10 may be any material desired upon which the amorphous silicon can be deposited and may be transparent or opaque to incident solar radiation. The substrate 10 can be a web or individual plates carried by a transport mechanism of metal foil, metal, glass or polymer. If metal, such as stainless steel or aluminum or polymer, the web can be supplied from a semi-continuous source, such as a large roll. If from a continuous web it can be advanced through a perforator 12 which perforates sprocket holes along the edges of the web for advancing the substrate 10 and for providing longitudinal reference marks so that the subsequent process steps can be longitudinally coordinated. It should be understood that the use of the perforations and sprockets can be dispensed with and an edge guide or other alignment system employed without departing from the scope of the present invention. After perforation, the substrate 10, if aluminum and if desired, is advanced through an anodizing bath 14 in which an aluminum oxide insulator layer 16 (see FIG. 4) is built up on the substrate, particularly on the surface where deposition is to occur. If stainless steel material is used for the substrate and an insulative coating is desired, then for example, $SiO_2$, $Si_3N_4$ or the like can be deposited.

Figure 4:
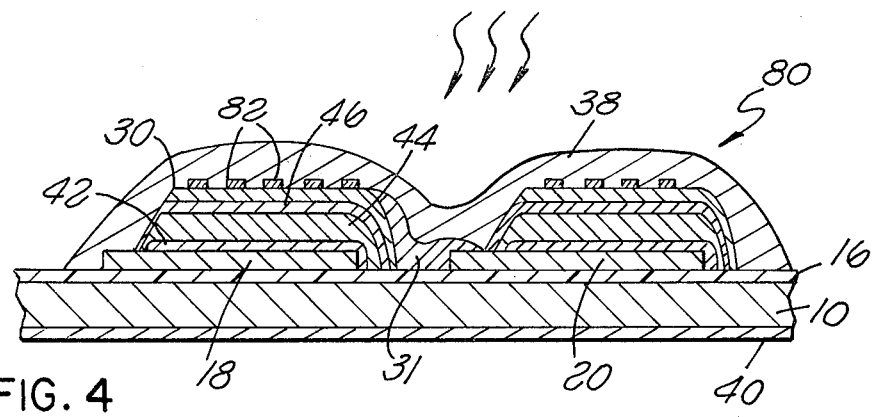
FIG. 4 is a side sectional view through one embodiment of P-I-N solar cell.

Next, a series of base contacts is placed on the insulator layer, when utilized. The base contacts can be longitudinally coordinated with the perforated sprocket holes so that subsequent operations can be accomplished with respect to the proper positioning of the base contacts. Two of the base contacts are shown in FIG. 4 and are indicated at 18 and 20. The orientation of the contacts can be selected as illustrated in FIG. 1, or as otherwise desired for an arrangement of series and parallel electrical connections required for a given device application. The base contact-applying equipment 22 is of conventional nature and typically includes the application of mechanical or lithographic masking followed by placement of the base contact and then followed by mask removal. The actual base contact placement can be accomplished by any means known to the art, such as vapor deposition, sputtering, silk screening, printing, or the like, and a detailed description thereof is not deemed necessary for those skilled in the art.

A conductive substrate can be utilized without an insulative layer and base contact, utilizing the substrate as a common electrode, which eliminates the insulating and contact depositing and masking steps. In this case all the cells of the device are connected in parallel (see FIG. 5) with the substrate providing a common electrode. Utilizing a glass or polymer substrate can, of course, eliminate the insulating step.

The perforating, anodizing and base contact placement, where utilized, can be carried on in a continuous manner with sequential equipment operating on the same moving substrate, but for some types of production, the steps are accomplished on the substrate on separate equipment, with the continuous substrate web being wound up after each operation. The significant amorphous silicon deposition onto the substrate 10 is carried on in the deposition chambers 24, 26 and 28, seen in FIGS. 1 and 2, with the interior of one embodiment of chamber 24 illustrated in FIG. 3. Although there is specifically illustrated in FIG. 2 three separate chambers or modules, it should be recognized by those skilled in the art that a single layer chamber properly segregated into specific deposition areas or regions, each of which region or area is dedicated solely to the deposition of amorphous material of a particular conductivity type (for example N-type, P-type, or intrinsic) can also be employed.

It should also be understood that each deposition area or region may be defined by a chamber length or by a plurality of dedicated chambers or modules depending upon the desired layer thickness and deposition rate. All the specific dedicated deposition regions in the system are mutually isolated from one another. The deposition system includes the successive glow discharge deposition of P-type, intrinsic and N-type layers of amorphous silicon (or in the reverse order) from plasmas of distinct reaction gas composition. By so isolating the deposition of different material types, a device is fabricated bearing layers of high electrical quality amorphous alloys.

After deposition of the amorphous silicon alloy layers, a top contact layer 30 is deposited on the top silicon layer to collect the current generated by the cell (FIG. 4). The top contact layer 30 is of transparent material when the substrate 10 is opaque to permit the radiant energy to pass to the silicon layers.

The transparent conductive materials commonly utilized are indium-tin oxide, tin oxide or indium oxide. For devices deposited on a transparent substrate the structure can be inverted with the top conductive oxide or TCO on the substrate and the opaque contact on the top. For most cases, the top contact layer is not sufficiently conductive to allow current collection from large area cells and a current collection grid of a suitable metal is used with the TCO, as is well known to those skilled in the art. For cases where cells are isolated electrically (not parallel connected by a common layer) the individual cells may be series connected or parallel connected by the additional deposition of a metallic connection 31 (FIG. 4).

Figure 6:
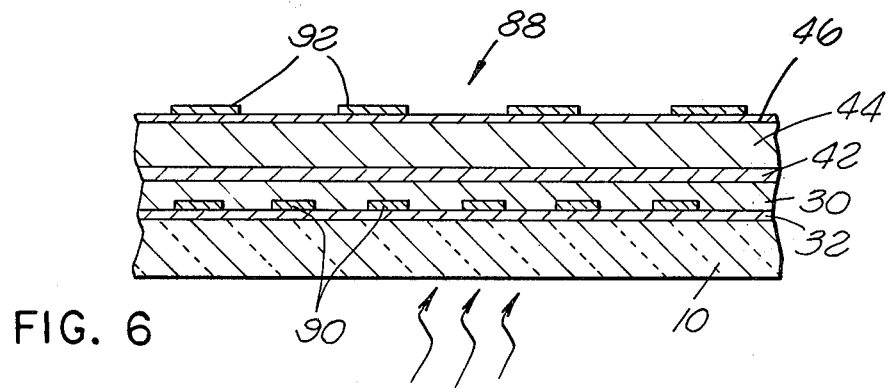
FIG. 6 is a side sectional view through a third embodiment of P-I-N solar cell.

In view of the fact that the amorphous silicon layers are highly reflective to visible solar radiation, much of the incoming energy would normally be reflected. In order to prevent that loss of energy, an anti-reflective (AR) coating 32 is applied (FIG. 6). The anti-reflective coating layer reduces the amount of light that would be reflected. The AR coating can be dielectric material such as zinc sulphide, zirconium oxide, silicon nitride and titanium oxide. However, where TCO is utilized as a top cell contact, the thickness of the TCO layer can be chosen to function as both the top contact and AR layer. This simplifies the cell structure and eliminates processing steps. Deposition equipment 34 illustrated in FIG. 1 deposits the top contact layer 30 and the anti-reflective coating 32 where utilized. This completes the solar cell structure, but in order to protect it from physical damage, lamination is desirable. Laminator 36 applies protective webs 38 and 40 to the top and bottom of the substrate which now carries all of the elements of the solar cell construction. After the lamination step, the sets of solar cells can be exteriorly connected and the web substrate, where utilized, is cut as required to supply the desired voltage and current. In this way, a continuous strip can be provided so that economic production of solar cells is achieved.

Figure 2:
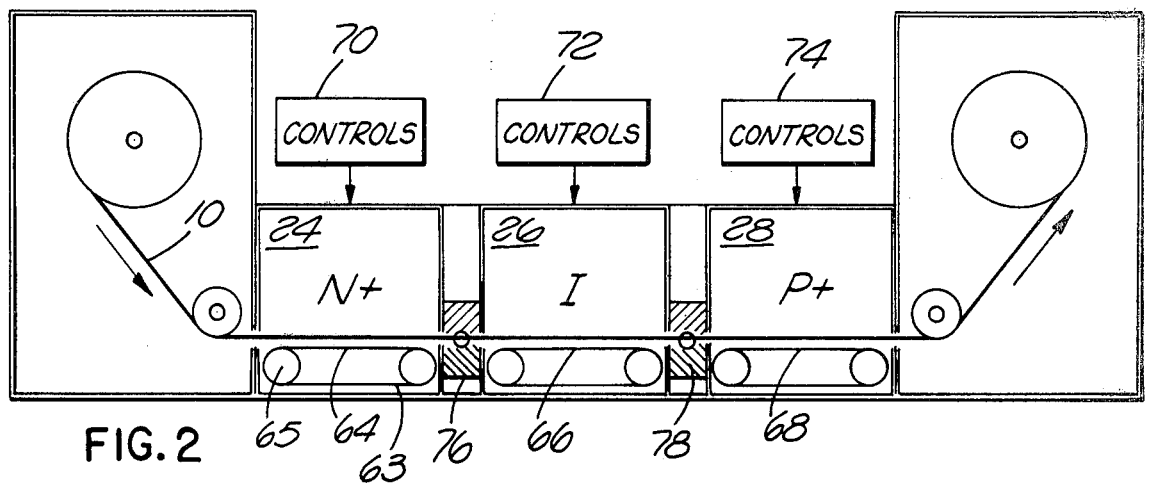
FIG. 2 is a diagrammatic view of one embodiment of the deposition chambers and the isolation therebetween.
Figure 7:
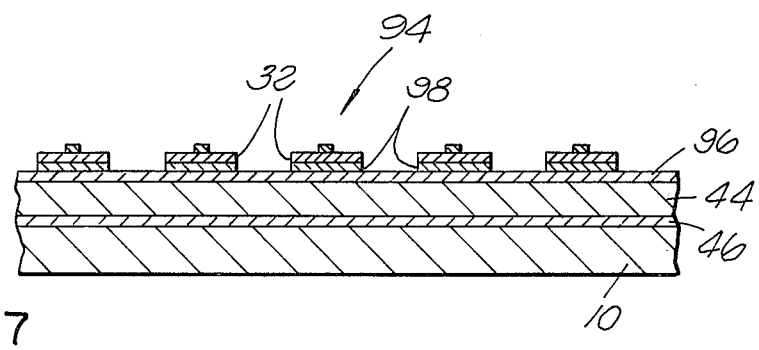
FIG. 7 is a side sectional view through one embodiment of M-I-S solar cell.

A critical portion of the system is the amorphous silicon deposition in the deposition chambers 24, 26 and 28, schematically illustrated in FIG. 2. Three dedicated deposition chambers are illustrated for the successive deposition of a P-doped amorphous silicon layer 42, an intrinsic amorphous silicon layer 44, and an N-doped amorphous silicon layer 46 (FIG. 4). As above-referenced, the chambers 24, 26 and 28 are mutually isolated to prevent the undesired admixture of reaction gas components therebetween and the deposition can be in the reverse order. This arrangement of layers as seen in FIG. 4 is for light coming from the top of the FIGURE as illustrated. If a transparent substrate is used instead of an opaque substrate 10, the incoming radiation can be received from the substrate side (FIG. 6). Furthermore, if desired, a Schottky barrier or M-I-S can be employed (FIG. 7). Thus, the number and length of deposition chambers or regions, their positioning along the line, and the materials deposited can be chosen in accordance with the desired solar cell structure.

Figure 3:
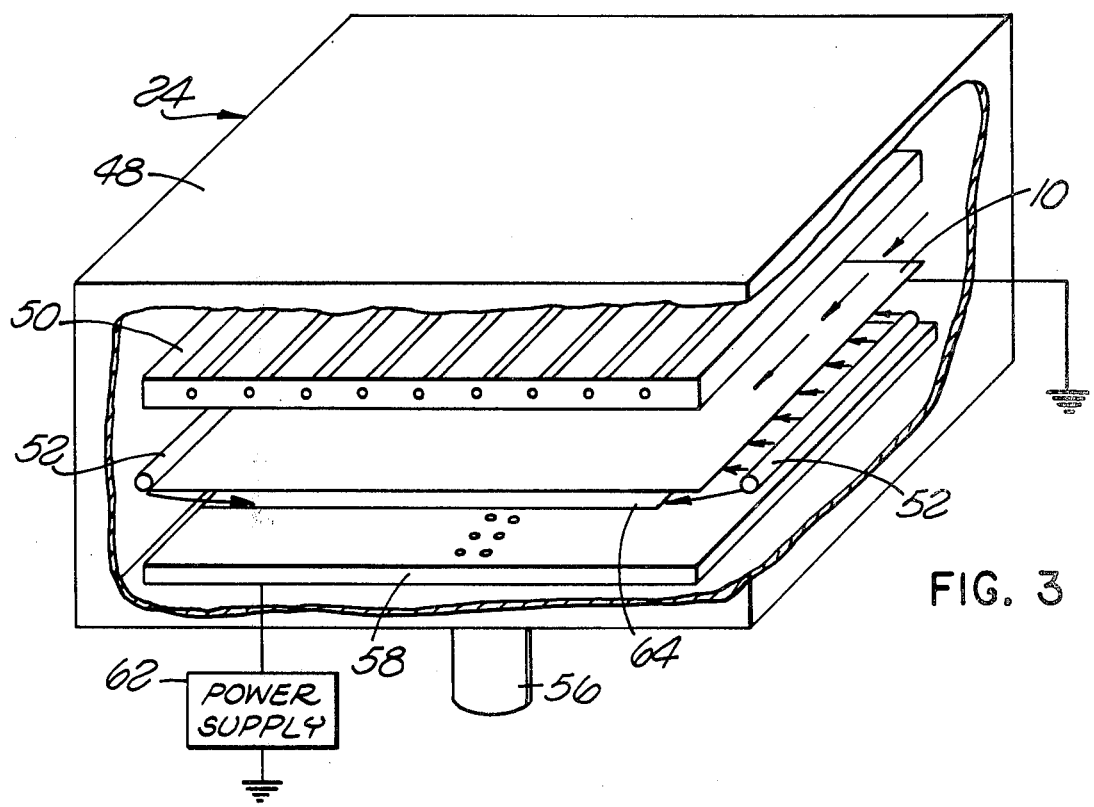
FIG. 3 is a perspective view, with the parts broken away, showing the construction of one embodiment of the glow discharge chambers of FIG. 2.

FIG. 3 schematically illustrates one embodiment of the deposition chamber 24 in further detail. In FIG. 3, the substrate 10 is moving toward the viewer. A housing 48 encloses the deposition chamber and provides for entry and exit of the substrate or substrates 10 on a substantially continuous basis, as is described below. A heater 50 can be a large area infrared radiant heater positioned adjacent the substrate 10, as viewed in FIG. 3, because deposition will occur on the opposite surface of the substrate 10. The substrate can be heated and the temperature thereof controlled by, for example, the method and apparatus disclosed in copending application Ser. No. 244,389, filed Mar. 16, 1981 for APPARATUS FOR REGULATING SUBSTRATE TEMPERATURE IN A CONTINUOUS PLASMA DEPOSITION PROCESS, filed concurrently herewith.

Process feed gas is supplied to the deposition side of the substrate 10, as from a pair of manifolds 52 and 54 which have apertures therein directing gas along the surface of substrate 10 in a direction normal to the direcreaction gas from the substrate 10 as it passes through the isolators.

The isolators can be constructed to form isolation valves as disclosed, for example, in copending application Ser. No. 244,385, filed Mar. 16, 1981 of Masatsugu Izu and David A. Gattuso for ISOLATION VALVE, filed concurrently herewith. In FIG. 2, the supply and takeup are shown as being in vacuum chambers, but in a fully continuous system, the substrate would come from and pass to other processes so that isolators would also be required at the entrance to chambers 24 and the exit from chamber 28. In this way, chamber isolation is achieved so that controlled and equilibrium operation can be maintained in each chamber, with continuous inflow of proper feed gas for amorphous silicon deposition and controlled inflow of doping gas, as well as vacuum withdrawal of the spent reaction gas so that stable plasma and deposition conditions are maintained in the chambers.

Referring now to FIGS. 4 through 7, four embodiments of solar cell devices fabricated by the system of the invention are best illustrated. It being understood that the dimensions and thicknesses of the cells and material layers are not drawn to scale. FIG. 4 partially illustrates a solar cell having a plurality of P-I-N cells 80. The substrate 10 can be a metal or an insulator. The cells 80 can be formed in strips isolated from one another by the masking previously described. The insulator layer 16 is deposited on the metal substrate 10 and could be eliminated if the substrate is an insulator.

A plurality of base contacts, two of which 18 and 20 are illustrated, are then deposited on the layer 16. The cell deposition is then identical on each contact and includes a P-type layer 42, followed by an intrinsic layer 44 and an N-type layer 46. The top contact layer 30, such as indium tin oxide, is then deposited followed by the AR coating if necessary. The cells can include a grid 82 to collect current and the grid 82 can be electrically connected to the other cells as desired, as by the connector metal 31. The whole device then can be protected and encapsulated by the lamination layers 38 and 40.

Figure 5:
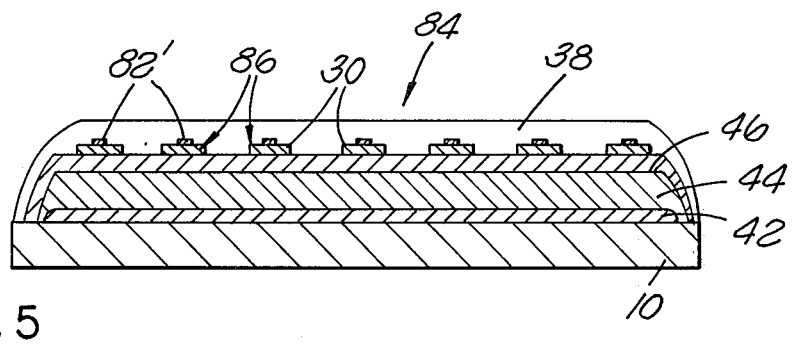
FIG. 5 is a side sectional view through a second embodiment of P-I-N solar cell.

FIG. 5 illustrates a second embodiment of P-I-N solar cell device 84. In this device, the metal substrate 10 will have the P-type layer 42, intrinsic layer 44, and N-type layer 46 deposited over the whole substrate. Individual cells 86, electrically connected in parallel, are defined by masking or photolithography of the TCO layer 30. The cells 86 also can include a grid 82' for current collection which can be connected as desired.

FIG. 6 illustrates a third embodiment of P-I-N cell device 88 with a transparent substrate, such as glass. In this case the light is illustrated coming through the substrate 10. The AR coating 32 is deposited on the substrate followed by a grid 90, where desired. The grid 90 then has the TCO layer 30 deposited thereon. The respective P-type, intrinsic and N-type layers 42, 44 and 46 are then deposited. Utilizing the P-type layer on the light transparent or entrance side, it may be desirable to add an intermediate layer between the TCO and the P-type layer to improve the electrical compatibility between the layers. Parallel bottom conductors 92 then would be deposited in the desired pattern on the top layer 46.

FIG. 7 illustrates an M-I-S type device 94. The metal substrate 10 is followed by the N-type layer 46 and intrinsic layer 44. An insulating layer 96 is deposited on top of the layer 44 followed by the high work function metal contacts 98 of the individual cells. The contacts 98 can be followed by an AR coating 32.

This invention has been described in its presently contemplated best mode, and it is clear that it is susceptible to numerous modifications, mode and embodiments within the ability of those skilled in the art and without the exercise of the inventive faculty. Accordingly, the scope of this invention is defined by the scope of the following claims.

What is claimed is:

1. A method of continuously producing photovoltaic devices of amorphous silicon comprising the steps of: anodizing an insulator layer on an elongated planar strip of aluminum substrate; placing a series of spaced base contacts on the anodized surface; providing a plurality of glow discharge plasmas, each of said plasmas being of a preselected character; providing a flow of gas to isolate plasmas of differing character; advancing said substrate through said plurality of plasmas in accordance with a preselected sequence; depositing from each of said glow discharge plasmas amorphous silicon over at least a portion of each base contact; and depositing a top contact over at least a portion of the deposited layer of amorphous silicon.

2. The method of claim 1 wherein the step of depositing amorphous silicon includes depositing a layer of intrinsic amorphous silicon.

3. The method of claim 1 wherein the top contact is placed so that it is in electrical connection with the adjacent base contact for series connection of successively deposited adjacent solar cells.

4. The method of claim 1 further including the step of uniformly flowing reaction gas containing silicon over the anodized face into the plasma and withdrawing spent reaction gas away from the plasma to maintain plasma equilibrium.

5. A method as defined in claim 4 wherein the step of withdrawing spent reaction gas from the plasma includes the additional step of exhausting gas from said plasma through an electrode.

6. A method of continuously producing photovoltaic devices of amorphous silicon comprising the steps of: feeding an elongated planer substrate through a plurality of dedicated reaction chambers; providing a continuous uniform flow of silicon containing reaction gas across the surface of said substrate during reaction time; causing a glow discharge plasma in the reaction gas for deposition of material on the surface said substrate; providing a flow of gas to substantially isolate the reaction gases in each of said chambers from the gases in the other chambers; and exhausting gases from said chambers.

7. The method of claim 6, wherein the step of isolating the chambers consists of providing a supply of inert gas to flow between said adjacent chambers.

8. A method as defined in claim 7 wherein doped and intrinsic amorphous silicon are deposited in adjacent reaction chambers.

9. A method of depositing amorphous silicon on a substrate comprising the steps of: loading a substrate into a dedicated chamber; holding said substrate having a first surface within said chamber; providing to said chamber a uniform flow of silicon containing reaction gas across the surface of said substrate; energizing an electrode thereby causing a glow discharge plasma to be formed adjacent the first surface of said substrate to deposit a coating comprising at least amorphous silicon on said substrate substantially; isolating the reaction gas tion of substrate advance and in a flow toward the center of the substrate. Alternatively, the reaction gases can be uniformly directed into the plasma region by, for example, the apparatus disclosed in copending application Ser. No. 244,383 filed Mar. 16, 1981 of Masatsugu Izu, Timothy J. Barnard and David A. Gattuso for CATHODE FOR GENERATING A PLASMA, filed concurrently herewith.

The feed gas to the reaction chamber is preferably $SiF_4$ and hydrogen and may include an inert gas diluent, such as argon and other elements as disclosed in the above-referred to U.S. Pat. No. 4,226,898 or in copending application Ser. No. 244,388, filed Mar. 16, 1981 of Vincent D. Cannella and Masatsugu Izu for IMPROVED METHOD FOR PLASMA DEPOSITION OF AMORPHOUS MATERIALS, filed concurrently herewith. Uniform gas flow is desired, and therefore a large number of feed apertures are provided from the manifold, which can be directed substantially parallel to and adjacent the deposition side of the substrate.

An exhaust port 56 is connected to a vacuum pump (not shown) by which the spent process gas is withdrawn to maintain pressure equilibrium. An electrode 58 is spaced from the substrate 10 and a plasma is developed therebetween. The gases are withdrawn through the electrode 58, preferably through a plurality of apertures 60, to maintain a uniform flow. In the plasma, the process gas is principally a silicon fluorine-hydrogen gas mix and includes various species such as $SiF_4$, $SiF_3$, $SiF_2$, $SiF$ as well as species including hydrogen such as $SiHF$, $SiHF_2$, $SiHF_3$ and so forth, plus the doping constituents as well known in the prior art. It will be recognized by those skilled in the art that some of the species are transistory in nature. The vacuum provided at the exhaust port 56 is such as to provide a pressure in which the glow discharge plasma can be sustained at the face of the substrate 10. A pressure in the range of 0.1–3 torr is preferred.

While the substrate 10 is grounded, the electrode 58 is connected to a power supply 62 which supplies the electrical energy for establishing and maintaining the glow discharge plasma adjacent the substrate 10 from which the amorphous silicon layers are deposited. The power supply 62 is typically an AC power supply operated in the radio frequency range, but can also be a DC supply operated at a voltage which produces the glow discharge plasma. If radio frequency power is desired, the source can, for example, be operated between 50 to 200 kiloHertz at low power as disclosed in the aforementioned copending application Ser. No. 244,388, filed Mar. 16, 1981. In addition to the power supplied, which produces the glow discharge plasma, power supply 62 can also apply a DC bias between the electrode and the substrate 10 to control the substrate bias. The DC bias applied across the plasma may give better control of the process of deposition of amorphous silicon from the plasma.

It may be necessary to mask the face of the substrate so that the plasma deposits the amorphous silicon only in the desired position when discrete or strip devices are being constructed. Masking can be accomplished by a traveling mask belt 64, see FIG. 2, which lies closely adjacent the face of the substrate 10 and moves therewith. Coordination of position can be accomplished by the perforated apertures at the edges of the substrate so that the mask 64 is properly positioned with respect to the substrate. The strip devices also can be oriented parallel with the substrate travel through the chambers and hence coordination of longitudinal position can be eliminated. The mask 64 is a continuous mask strip and moves around guide rolls 65 (FIG. 2) in the housing 48. The lower, inactive portion 63 (FIG. 2) of the mask belt 64 can be positioned below the electrode 58. In view of the large open area of the mask belt, it does not interface with exhaust gas flow out of the exhaust port 56 to the vacuum pump.

Each of the isolated chambers 24, 26 and 28 is similar, with the chambers 26 and 28 respectively having corresponding mask belts 66 and 68, each of which moves with the forward motion of the substrate 10. Each of the chambers 24, 26 and 28 can be of the same physical construction, but, due to the individual layer type to which each is dedicated, the constituents of the plasma generated within each is slightly different. The feed gas to the manifolds can be different for each of the chambers, or the feed gas can be the same in each of the chambers with a separate feed of doping gas such as phosphine ($PH_3$) for N-type conductivity or diborane ($B_2H_6$) for P-type conductivity. For example, a separate supply of doping gas in an inert gas, such as argon, could be provided. In view of the desire to maintain a uniform flow of fresh feed gas to the deposition surface of the substrate 10, when a separate supply of mixed doping and inert gas is provided, it is preferable to achieve mixing before the gas is injected into the manifolds 52 and 54 and is released out of the manifold openings.

The residence time of the substrate 10 in each of the chambers 24, 26 and 28 differs and depends upon the deposition rate and the desired thickness of the layer to be deposited. For example, where a P-I-N device is being constructed, the respective thicknesses can be in the range of 50–200 Angstroms, 2000–6000 Angstroms and 100–500 Angstroms. Thus, with a continuous web system, the different deposition regions would be of a length proportional to the thickness to be deposited for its respective type. The thickness of the deposited layers can be monitored and controlled, for example, by the method and apparatus disclosed in copending application Ser. No. 244,387, filed Mar. 16, 1981 of Robert F. Edgerton for OPTICAL METHODS FOR CONTROLLING LAYER THICKNESS, filed concurrently herewith.

Controllers 70, 72 and 74 are respectively connected to control the process variables in each of the chambers 24, 26 and 28, including the supply feed gas for the plasma deposition of the amorphous silicon and the doping gas. Also controlled is the vacuum pump to maintain the proper pressure level to maintain equilibrium for the proper plasma discharge and temperature controls for the heater. In this way, continuous production is achieved. The system can either be operated with continuous slow substrate advance or can be operated so that the active portions of the substrate are cyclically advanced from one process step to the next.

Each of the deposition chambers must have a controlled gas atmosphere both for supplying the correct conditions for amorphous silicon deposition and for proper doping levels. The slits through which the substrate 10 advances into and out of each chamber are narrow, but further protection from intermixing and contamination is required. Isolation can be provided by isolators 76 and 78 which enclose the substrate 10 with a narrow slit through which the substrate enters. A central cavity in the isolators can be evacuated or provided with flowing argon or other inert gas to clear all in said chamber from gases in other chambers; exhausting gas from said chamber through said electrode to maintain equilibrium pressure in said chamber; and removing said substrate from said chamber.

10. The method of claim 9 further including the step of applying a DC bias to said substrate relative said electrode.

11. A method for depositing adjacent layers of doped and intrinsic amorphous semiconductor material on a substrate comprising the steps of:
 a. dedicating adjacent glow discharge areas to the deposition of doped and intrinsic amorphous material by providing a preselected reaction gas mixture to each;
 b. providing a flow of gas to substantially isolate the gas mixtures between said areas;
 c. activating a glow discharge deposition plasma from said preselected reaction gas mixture in each of said areas; and
 d. sequentially advancing said substrate through said adjacent areas so that there is deposited thereon adjacent layers of doped and intrinsic amorphous material.

12. A method as defined in claim 11 including glow discharge areas dedicated to the deposition of layers of n-type, p-type and intrinsic amorphous semiconductor material.

13. A method as defined in claim 11 wherein each of said areas is a glow discharge deposition chamber.

14. A method as defined in claim 11 or 13 wherein said reaction gases comprise:
 a. feed gas applied to all glow discharge areas; and
 b. doping gas applied to preselected glow discharge areas.

15. A method as defined in claim 14 wherein said doping gas is $PH_3$.

16. A method as defined in claim 14 wherein said doping gas is mixed with an inert gas when applied to a glow discharge area.

17. A method as defined in claim 16 wherein said inert gas is argon.

18. A method as defined in claim 17 wherein said doping gas is PH.

19. A method as defined in claim 17 wherein said doping gas is $B_2H_6$.

20. A method as defined in claim 14 wherein said doping gas is $B_2H_6$.

21. A method as defined in claim 11 wherein the step of isolating the chambers consists of providing a supply of inert gas to flow between adjacent chambers.

* * * * *